(12) United States Patent
Benzel et al.

(10) Patent No.: US 7,026,224 B2
(45) Date of Patent: Apr. 11, 2006

(54) METHOD FOR DICING SEMICONDUCTOR CHIPS AND CORRESPONDING SEMICONDUCTOR CHIP SYSTEM

(75) Inventors: Hubert Benzel, Pliezhausen (DE); Julian Gonska, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 10 days.

(21) Appl. No.: 10/954,059

(22) Filed: Sep. 29, 2004

(65) Prior Publication Data
US 2005/0087843 A1 Apr. 28, 2005

(30) Foreign Application Priority Data
Oct. 27, 2003 (DE) ................................ 103 50 036

(51) Int. Cl.
*H01L 21/46* (2006.01)
(52) U.S. Cl. .......................... 438/460; 438/33; 438/68; 438/113; 438/114; 438/458; 438/462; 257/620; 257/623
(58) Field of Classification Search ................ None
See application file for complete search history.

(56) References Cited

U.S. PATENT DOCUMENTS
6,686,225 B1 * 2/2004 Wachtler .................... 438/114

FOREIGN PATENT DOCUMENTS
DE 198 26 382 12/1999
WO WO 02/02458 1/2002

OTHER PUBLICATIONS

Y. Tsunashima et al., "A new substrate engineering technique to realize silicon on nothing (SON) structure utilizing transformation of sub-micron trenches to empty space in silicon (ESS) by surface migration," Electrochemical Society Proceedings, vol. 2000-17, pp. 432-545.

* cited by examiner

*Primary Examiner*—Andy Huynh
(74) *Attorney, Agent, or Firm*—Kenyon & Kenyon

(57) ABSTRACT

A method for dicing semiconductor chips and a corresponding semiconductor chip system are described. The met-hod includes the steps: provision of a substrate having an upper substrate level, a middle substrate level and a lower substrate level; a plurality of empty spaces or porous areas being provided in the middle substrate level, the empty spaces or porous areas being enclosed by a substrate frame area; the empty spaces or porous areas being situated under a particular semiconductor chip area which is delimited by a semiconductor chip peripheral area in such a way that a particular substrate frame area is distanced from a vertical extension of the particular corresponding semiconductor peripheral area by a lateral intermediate space. In the case of the empty spaces, at least one substrate support element is provided to bond the lower substrate level to a particular semiconductor chip area in the upper substrate level. A lateral separation of the semiconductor chip areas is produced by severing the upper substrate level above the particular intermediate space along the particular semiconductor chip peripheral area. The semiconductor chip areas are diced into semiconductor chips by severing the particular substrate support elements.

13 Claims, 4 Drawing Sheets

METHOD FOR DICING SEMICONDUCTOR CHIPS AND CORRESPONDING SEMICONDUCTOR CHIP SYSTEM

FIELD OF THE INVENTION

The present invention relates to a method for dicing semiconductor chips and a corresponding semiconductor chip system.

BACKGROUND INFORMATION

Although applicable to any semiconductor chip systems, the present invention and the problem on which it is based is explained in relation to a micromechanical semiconductor chip system.

Customarily, semiconductor chips are manufactured as a composite on semiconductor wafers. Depending on the chip and wafer size, such semiconductor wafers contain up to several thousand components. After the semiconductor chips are produced in a composite on the semiconductor wafers, they must be separated from one another by dicing. This is normally carried out using a wafer saw.

A wafer saw has a circular saw blade having a width less than 100 μm, which rotates, for example at a rotational speed of 12000 rpm. The surface of the saw blade is coated with diamond chips. In order to cool the wafer surface and the saw blade during the sawing process as well as to clean off the particles produced during the sawing process, the surface of the wafer is rinsed with water.

This method is suitable for dicing semiconductor chips, which are insensitive to the action of particles and water at the end of the manufacturing process. However, many micromechanical sensor chips have structures which may be destroyed by the action of particles and/or water during the sawing process. A customary method for protecting such sensitive structures is to bond a cap onto the sensor chips before the semiconductor chips are diced.

An example of such micromechanical sensor chips is inertial sensors, which are used to measure measured quantities, which require no measuring medium for propagation or are able to pass through the cap, such as, for example, an acceleration sensor working on a capacitive measuring principle. A customary embodiment of the sensor chip has a very delicate finger structure, which would become stuck under the action of water. Since the sensor chip retains its function even when hermetically sealed, a cap is bonded to the substrate wafer before sawing.

An example of such a micromechanical structure, which is not to be hermetically sealed, is a micro total analysis system (μTAS). In such a system, units are integrated on a micro-fluidic chip for the preparation, separation and detection of chemical or biological solutions. The fluidic channels must have accesses in order to be able to infuse the analysate. The particles arising during the sawing process may accumulate in the accesses and clog them. Water could enter the system by capillary force and destroy the functionality of the μTAS.

SUMMARY

In contrast to the conventional approaches, the example method of the present invention for dicing semiconductor chips and the corresponding example semiconductor chip system may have the advantage that it is possible to dice semiconductor chips without generating particles or without the action of water. In contrast to sawing, the semiconductor chips are not diced serially but instead in parallel. The duration of the process is thus not dependent on the number of substrate chips per substrate wafer but instead solely on the thickness of the semiconductor chips. In particular, the method makes it possible to manufacture substrate chips of any thickness and of any shape such as, for example, round substrate chips. In particular, it is possible to manufacture chips having needle-shaped structures.

The idea on which the present invention is based is to provide a plurality of empty spaces or porous areas having high porosity in a middle substrate level of a substrate enclosed by a substrate frame area, the empty spaces being situated under a particular semiconductor chip area in the upper substrate level which is delimited by a semiconductor chip peripheral area in such a way that a particular substrate frame area is distanced from a vertical extension of the particular corresponding semiconductor chip peripheral area by a lateral intermediate space. At least one substrate support element of substrate material or substrate material made porous is provided in the hollow spaces to bond the lower substrate level to a particular semiconductor chip area in the upper substrate level. This may even be dispensed with in porous areas.

Dicing is performed by a first separation step to separate the semiconductor peripheral areas and a second separation step to separate the substrate support areas.

According to a preferred refinement, the substrate support elements are columns whose diameter is significantly less than a diameter of the substrate frame area.

According to a preferred refinement, the porous areas are partially or completely oxidized. This makes them easier to sever.

According to another preferred refinement, an additional substrate level is applied to the upper substrate level, the semiconductor chips being processed in the additional substrate level before the semiconductor chip areas are separated laterally. This has the advantage of mechanically reinforcing the upper substrate level.

According to another preferred refinement, the additional substrate level is applied by epitaxy or substrate-to-substrate bonding.

According to another preferred refinement, the lateral separation of the semiconductor chip areas is performed by an etching process using an appropriate etching mask. This has the advantage that the chip is not limited to a square shape but instead it may assume any geometric shapes.

According to another preferred refinement, the etching process is an anisotropic dry etching process. This has the advantage of requiring less space than wet etching.

According to another preferred refinement, the particular substrate support elements are divided by a mechanical pick up process. This has the advantage that it is possible to mount the semiconductor chips to a circuit substrate or a component housing immediately in the same step.

According to another preferred refinement, the substrate is a wafer substrate.

BRIEF DESCRIPTION OF THE DRAWINGS

An exemplary embodiment of the present invention is depicted in the figures and explained in greater detail below.

DETAILED DESCRIPTION OF EXAMPLE EMBODIMENTS

Identical reference symbols in the figures denote identical components or components having identical functions.

Figure 1:
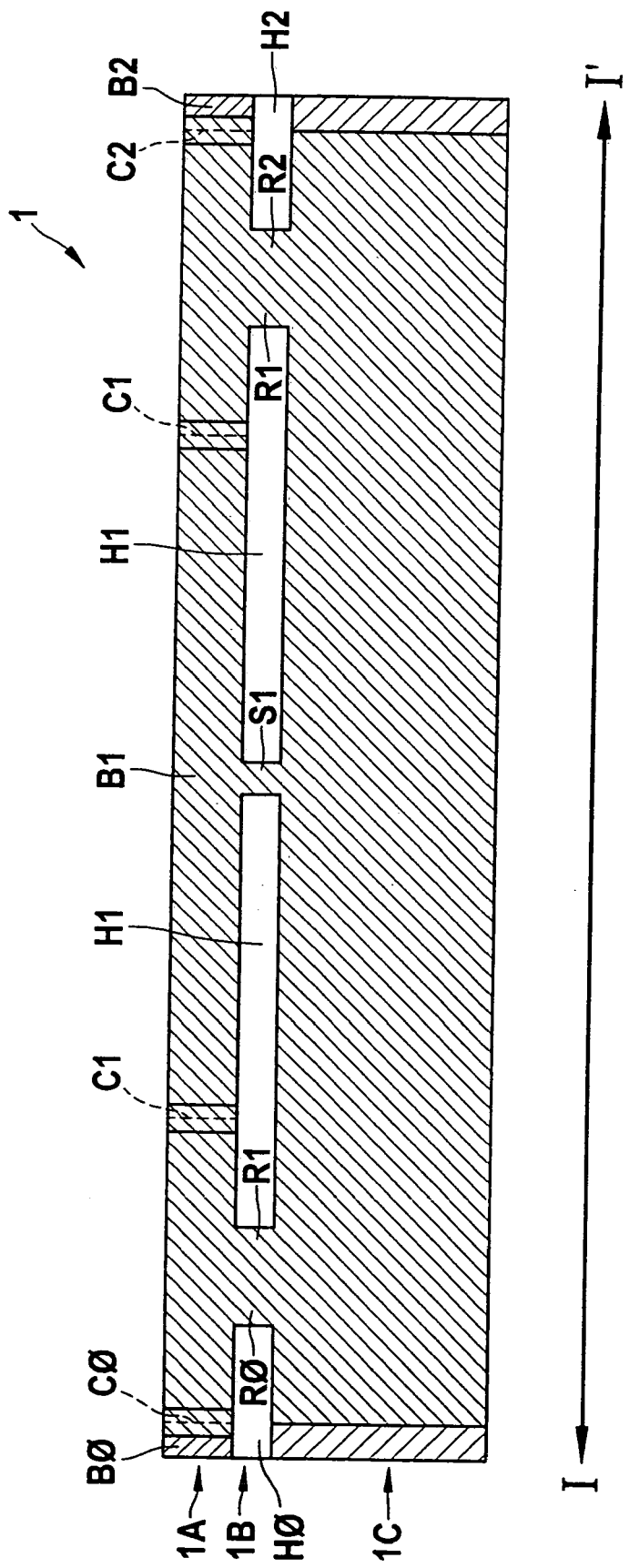
FIGS. 1–4 show steps of a first embodiment of the method of the present invention for dicing semiconductor chips and a corresponding semiconductor system.
Figure 2:
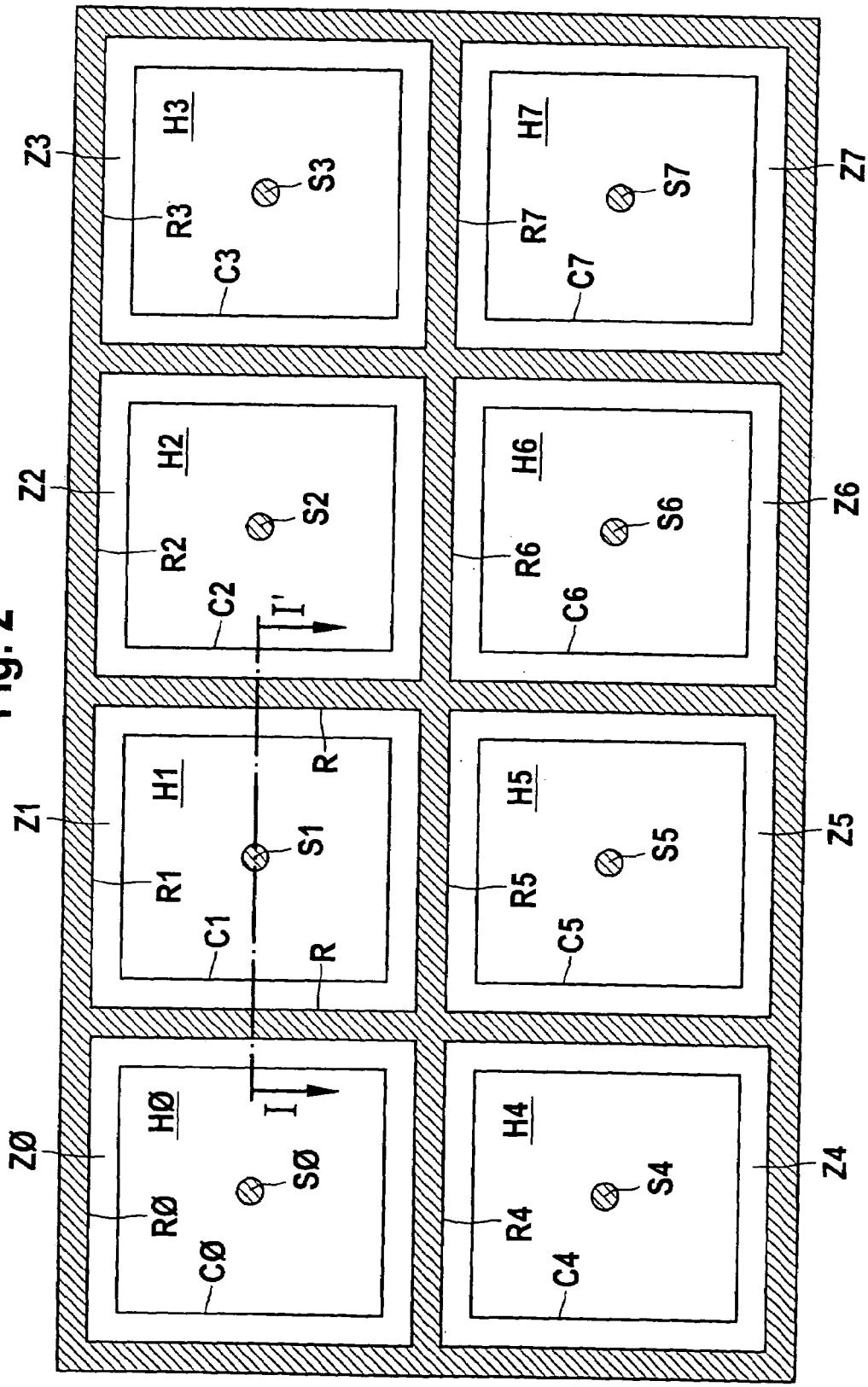

FIG. 1 shows a cross-section along line I–I" of on embodiment of the semiconductor chip system of the present invention and FIG. 2 shows a cross-section through middle substrate level 1B of the substrate of FIG. 1 along line I–I'.

In FIG. 1, reference symbol 1 denotes a silicon wafer substrate, which has an upper substrate level 1A, a middle substrate level 1B and a lower substrate level 1C.

In the middle substrate level 1B of the substrate, a plurality of empty spaces H0 through H7 is provided, which are enclosed by a particular substrate frame area R0 through R7. As is evident from FIG. 2, in which the cross-section according to FIG. 1 is indicated by line I–I', the empty spaces are situated in substrate level 1A under a semiconductor chip area B0 through B7 which is limited by a particular peripheral area C0 through C7 in such a way that a particular substrate frame area R0 through R7 is distanced from a vertical extension of the particular corresponding semiconductor peripheral area C0 through C7 by a lateral intermediate space Z0 through Z7.

In empty spaces H0 through H7, a substrate support element S0 though S7 is provided to bond lower substrate level 1C to a particular semiconductor chip area B0 through B7 in upper substrate level 1A, substrate support elements S0 through S7 having a columnar shape. The diameter of substrate support elements S0 through S7 is significantly less than the diameter of substrate frame areas R0 through R7.

There are various conventional methods for producing empty spaces H0 through H7 according to FIG. 1 and FIG. 2.

The creation of an empty space by producing a porous silicon diaphragm is described in, for example, International Application WO 02/02458. An area structured by a mask is etched electrochemically by a hydrofluoric acid solution to make it porous. This results in a porous diaphragm. The current density is increased after some time so that the areas lying under it are nearly completely dissolved away and a highly porous area is formed. A subsequent heating step causes the silicon to be rearranged, the porous diaphragm being sealed and the empty space structure according to FIG. 1 being produced.

In another conventional method, described in a publication by Y. Tsunashima, T. Sato, I. Mizushima, "A new substrate engineering technique to realize silicon on nothing (SON) structure utilizing transformation of sub-micron trenches to empty space in silicon (ESS) by surface migration," Electrochemical Society Proceedings, vol. 2000-17, pages 432–545, anisotropic etching using sulfur hexafluoride produces narrow channels on a substrate wafer by masking. In a subsequent heating step, the silicon is rearranged in such a way that an empty space having a diaphragm as in FIG. 1 is produced.

According to still another exemplary method, a porous layer is produced in a substrate wafer, and it is partially oxidized. Before a subsequent epitaxy, the oxide layer on the surface is removed by a brief etching step. As a result, silicon may grow by single-crystal epitaxy. The silicon oxidized to make it porous is not rearranged due to the oxide structure. After a heating step, a trenched porous oxide layer remains. A flat porous layer may replace the supporting structures. The porosity is adjusted in such a way that the chips may only be broken out during the separation.

Figure 3:
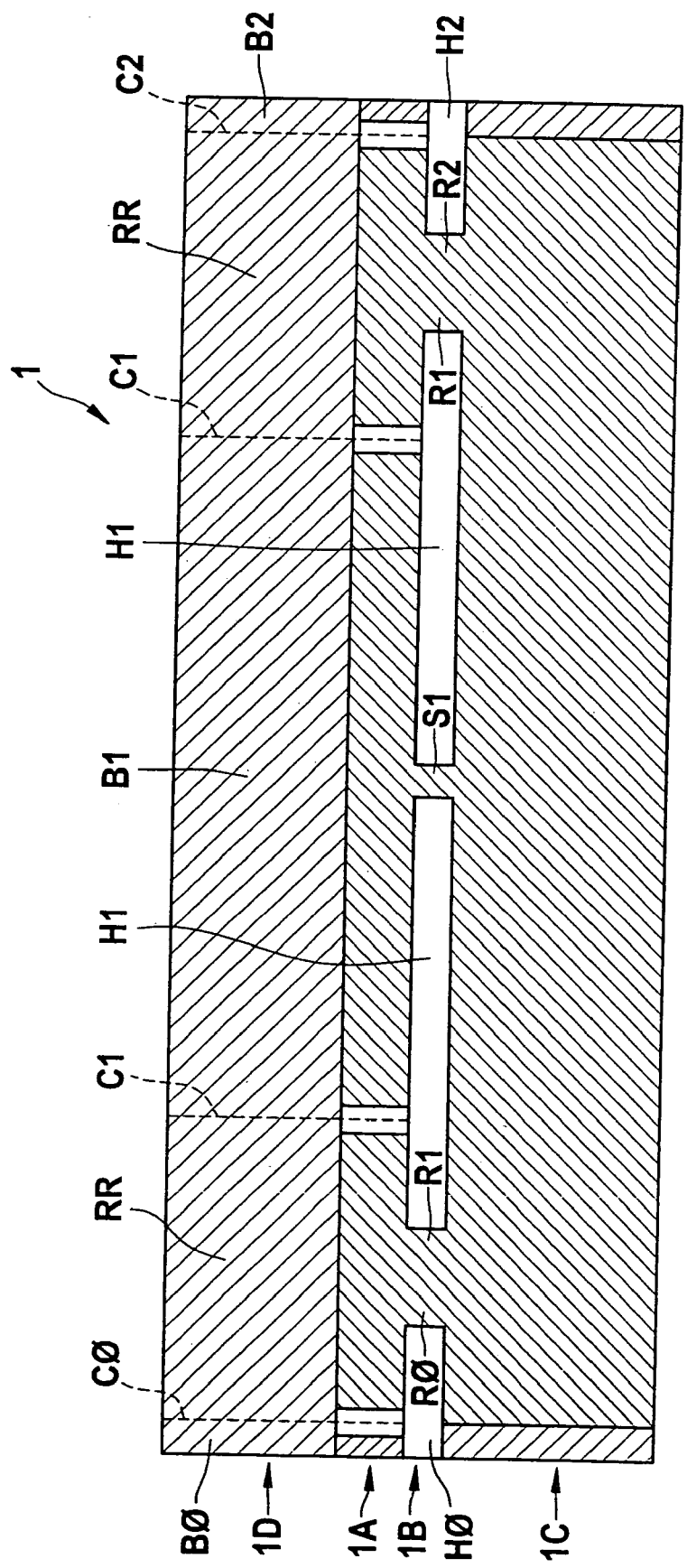

Further referring to FIG. 3, which corresponds to the cross-section of FIG. 1, an additional substrate level 1D, for example, in the form of a monocrystalline silicon layer, is produced on upper substrate level 1A. Another possibility for this is to bond an additional substrate wafer of any thickness. Thus, the final semiconductor chip may be set to any desired thickness via upper substrate level 1A. Using the substrate thus produced, any standard micromechanical or microelectronic processes may subsequently be run to implement the function of the semiconductor chips in semiconductor chip areas B0 through B7. As FIG. 3 shows, residual frame areas RR lie between the semiconductor chip areas, which are enclosed by the semiconductor chip peripheral areas.

Figure 4:
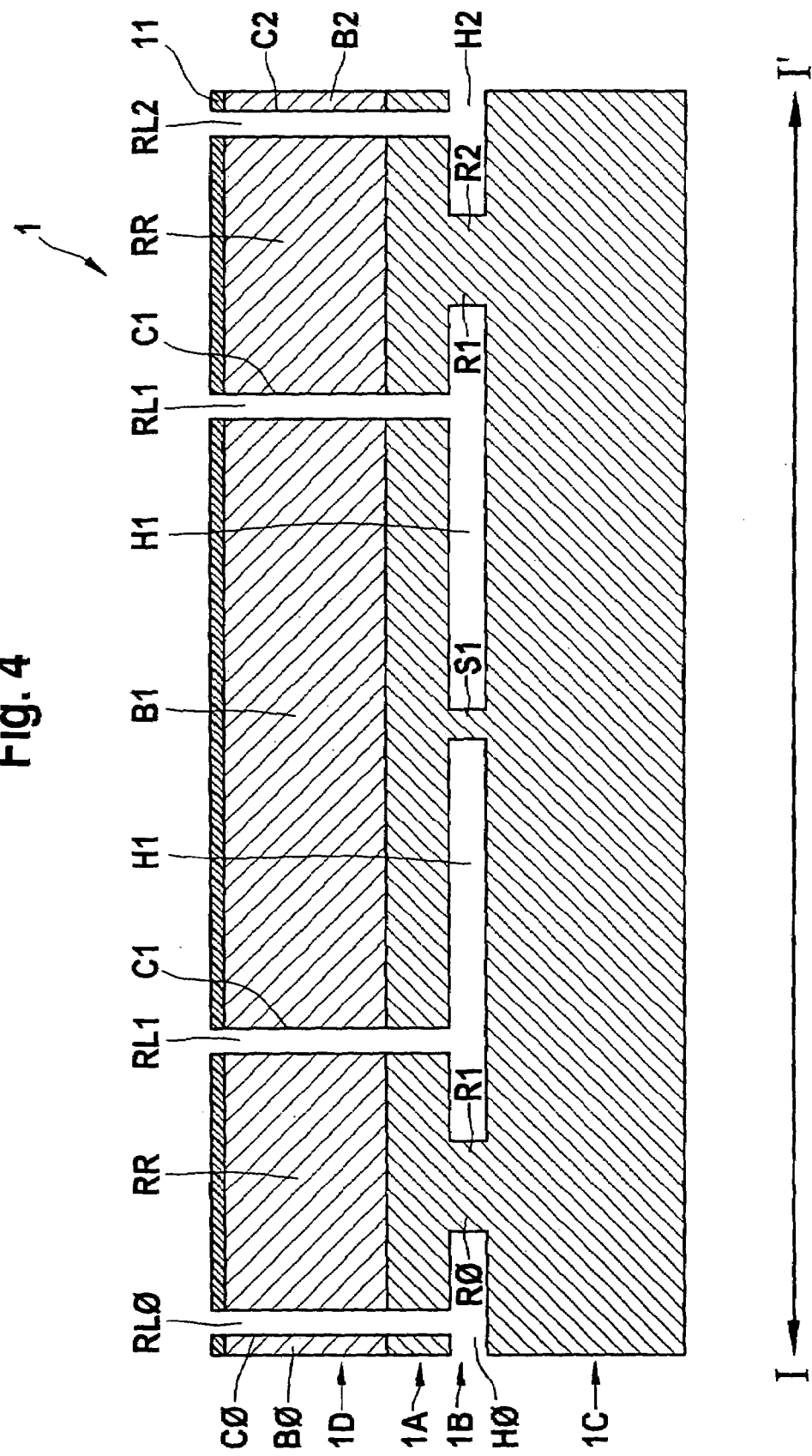

Finally, referring to FIG. 4, which corresponds to the cross-section of FIG. 1 or FIG. 3, a mask M, preferably formed from a photoresist having openings on which trench areas RL0, RL1, RL2, etc. are etched, which produce a lateral separation of semiconductor chip areas B0 through B7, in that upper substrate levels 1A, 1D are etched through above particular intermediate space Z0 through Z7 along particular semiconductor chip peripheral area C0 through C7. A reactive ion etching process using sulfur hexafluoride, which is particularly suitable, is described in German Patent Application No. DE 198 26 382. Substrate support elements S0 through S7 cause the semiconductor chips to remain initially on lower substrate level 1C.

In a concluding step, semiconductor chip areas B0 through B7 are diced to form semiconductor chips by dividing particular substrate support elements S0 through S7 in a mechanical pick-up step (pick and place method), which makes subsequent further processing possible, for example, mounting on a circuit substrate or a component housing in the same step.

The rupture edges remaining on the back of the semiconductor chip or residues of substrate support elements S0 through S7 are as a rule not interfering because if the height of the empty spaces is properly set, their height is limited to a few micrometers.

Although the present invention was explained above with reference to a preferred exemplary embodiment, it is not limited to it but instead may also be implemented in another manner.

In particular, the substrate may also be a multilayer substrate and is not limited to the wafer substrate.

The semiconductor chips may also be processed directly in the upper substrate level.

Instead of the empty spaces, easily separable highly porous areas may also be provided, which may be oxidized completely or partially. This increases the storage stability of the semiconductor chips after the lateral separation process.

List of reference symbols:

| | |
|---|---|
| 1 | Wafer substrate |
| 1A, 1B, IC, 1D | Substrate levels |
| C0–C7 | Semiconductor chip peripheral areas |
| B0–B7 | Semiconductor chip areas |
| S0–S7 | Substrate support areas |
| Z0–Z7 | Intermediate spaces |
| R0–R7 | Substrate frame area |
| RR | Residual frame areas |
| RL0–RL7 | Trench areas |

What is claimed is:

1. A method for dicing semiconductor chips, comprising:
providing a substrate having an upper substrate level, a middle substrate level and a lower substrate level;
providing a plurality of empty spaces in the middle substrate level, the empty spaces being enclosed by a respective substrate frame area, each of the empty spaces being situated under a corresponding semiconductor chip area in the upper substrate level, each corresponding semiconductor chip being delimited by a semiconductor chip peripheral area in such a way that a particular substrate frame area is distanced from a vertical extension of the corresponding semiconductor chip peripheral area by a lateral intermediate space;
providing at least one substrate support element in each of the empty spaces to bond the lower substrate level to a particular semiconductor chip area in the upper substrate level;
severing the upper substrate level above the particular intermediate space along the particular semiconductor chip peripheral area to laterally separate the semiconductor chip areas; and
dicing the semiconductor chip areas into semiconductor chips by severing the substrate support elements.

2. A method for dicing semiconductor chips, comprising:
providing a substrate having an upper substrate level, a middle substrate level and a lower substrate level;
providing a plurality of porous areas in the middle substrate level, which each is enclosed by a respective substrate frame area, the porous areas being situated under a corresponding semiconductor chip area, which is delimited by a corresponding semiconductor chip peripheral area, in such a way that a particular substrate frame area is distanced from a vertical extension of the corresponding semiconductor peripheral area by a particular lateral intermediate space;
severing the upper substrate level above the particular intermediate space along the particular semiconductor chip peripheral area to laterally separate the semiconductor chip areas; and
dicing the semiconductor chip areas into semiconductor chips by severing the porous areas.

3. The method as recited in claim 1, wherein the substrate support elements are columns whose diameter is significantly less than one diameter of the substrate frame area.

4. The method as recited in claim 2, wherein the porous areas are one of partially or completely oxidized.

5. The method as recited in claim 1, further comprising:
applying an additional substrate level to the upper substrate level in which the semiconductor chips are processed before the semiconductor chip areas are separated laterally.

6. The method as recited in claim 5, wherein the additional substrate level is applied by epitaxy or substrate-to-substrate bonding.

7. The method as recited in claim 1, wherein the lateral separation of the semiconductor chip areas is performed by an etching process using an appropriate etching mask.

8. The method as recited in claim 7, wherein the etching process is an anisotropic dry etching process.

9. The method as recited in claim 1, wherein the particular substrate support elements are severed by a mechanical pick-up process.

10. The method as recited in claim 2, wherein the porous areas are severed by a mechanical pick-up process.

11. The method as recited in claim 1, wherein the substrate is a wafer substrate.

12. A semiconductor chip system, comprising:
a substrate having an upper substrate level, a middle substrate level and a lower substrate level; and
a plurality of empty spaces provided in the middle substrate level, each of which are enclosed by a respective substrate frame area, the empty spaces being situated under a particular semiconductor chip area in the upper substrate, each of the particular substrate being delimited by a semiconductor chip peripheral area in such a way that a particular substrate frame area is distanced from a vertical extension of the corresponding semiconductor peripheral area by a lateral intermediate space; and
at least one substrate support element provided in each of the empty spaces to bond the lower substrate level to a particular semiconductor chip area in the upper substrate level.

13. A semiconductor chip system, comprising:
a substrate having an upper substrate level, a middle substrate level and a lower substrate level; and
a plurality of porous areas provided in the middle substrate level, each of which being enclosed by a respective substrate frame area, the porous areas being situated under a corresponding semiconductor chip area in the upper substrate level being delimited by a semiconductor chip peripheral area, in such a way that a particular substrate frame area is distanced from a vertical extension of the corresponding semiconductor peripheral area by a lateral intermediate space.

* * * * *